United States Patent
Kathiresan et al.

(10) Patent No.: US 9,881,122 B2
(45) Date of Patent: Jan. 30, 2018

(54) OVERLAY SAMPLING REDUCTION

(71) Applicant: GLOBALFOUNDRIES Inc., Grand Cayman (KY)

(72) Inventors: Hariharasudhan Kathiresan, Dresden (DE); Eric Cotte, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/084,576

(22) Filed: Mar. 30, 2016

(65) Prior Publication Data
US 2017/0286586 A1  Oct. 5, 2017

(51) Int. Cl.
*G06F 17/50* (2006.01)
*G03F 7/20* (2006.01)

(52) U.S. Cl.
CPC ...... *G06F 17/5081* (2013.01); *G03F 7/70633* (2013.01)

(58) Field of Classification Search
USPC .......................................................... 716/51
See application file for complete search history.

(56) References Cited

U.S. PATENT DOCUMENTS

| | | | |
|---|---|---|---|
| 7,586,609 B2 * | 9/2009 | Lin | G03F 7/705 356/401 |
| 2002/0105649 A1 * | 8/2002 | Smith | G03F 7/70558 356/401 |
| 2003/0223630 A1 * | 12/2003 | Adel | G03F 7/705 382/145 |

* cited by examiner

*Primary Examiner* — Eric Lee
(74) *Attorney, Agent, or Firm* — Ditthavong & Steiner, P.C.

(57) ABSTRACT

Method and apparatus for reducing overlay measurements and predicting overlay in unmeasured regions of a wafer are provided. Embodiments include providing a wafer having sets of four fields sharing a common vertex; measuring overlay values near each corner of each field, except for a corner near the common vertex of a first field and a corner near the common vertex of a second field of each set; decomposing the measured overlay values into measured interfield and intrafield correctable and non-correctable errors; forming a virtual stack of all fields; determining an average intrafield correctable error and intrafield non-correctable error for each corner of the virtual stack based on the measured intrafield correctable and non-correctable errors, respectively; and predicting the overlay values for the unmeasured corners of each set based on combinations of the measured interfield correctable and non-correctable errors and the average intrafield correctable and non-correctable errors.

20 Claims, 2 Drawing Sheets

OVERLAY SAMPLING REDUCTION

TECHNICAL FIELD

The present disclosure relates to semiconductor device overlay measurement processes. The present disclosure is particularly applicable to semiconductor devices formed by lithography.

BACKGROUND

Overlay is an important parameter to control in Lithography. Overlay is the measurement of misalignment of the current layer with respect to the previous layer. In general, the optimal way to ensure the quality of a wafer in terms of overlay is by measuring every field of the wafer and by measuring at least four corners per field. Corrections are then made using automatic process control (APC) based on the overlay data obtained from all of the corners of all of the fields. A full overlay map requires approximately 1200 to 1500 points per wafer. Foundries generally need to measure at least two wafers per lot. Measuring approximately 2500 points per lot has a large impact on the throughput of a foundry. One solution is to measure only one wafer per lot or to decrease the number of points measured per wafer. However, reducing the number of measured data points increases the likelihood of not detecting real errors in the wafer, thereby reducing the quality of the wafers. Consequently, current foundries must make a tradeoff between throughput and quality.

A need therefore exists for methodology and apparatus enabling a reduction of the number of measured points per wafer while maintaining the quality of wafer production.

SUMMARY

An aspect of the present disclosure is a method of reducing the overlay measurement sampling across a wafer and predicting the overlay in the unmeasured regions of the wafer.

Another aspect of the present disclosure is an apparatus for reducing the overlay measurement sampling across a wafer and predicting the overlay in unmeasured regions of the wafer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a wafer having plural sets of four fields, each field having four corners and the four fields of each set sharing a common vertex; measuring overlay values near each corner of each field of each set, except for a corner near the common vertex of a first field and a corner near the common vertex of a second field of each set; decomposing the measured overlay values into measured interfield correctable and non-correctable errors and measured intrafield correctable and non-correctable errors; forming a virtual stack of all fields of the wafer; determining an average intrafield correctable error and an average intrafield non-correctable error for each corner of the virtual stack based on the measured intrafield correctable and non-correctable errors, respectively; and predicting the overlay values for the corners near the common vertex of the first and second fields of each set based on combinations of the measured interfield correctable and non-correctable errors, the average intrafield correctable errors, and the average non-correctable errors.

Aspects of the present disclosure include the combinations for predicting the overlay values being respectively distinguished by the average intrafield correctable error and the average intrafield non-correctable error for each corner of the virtual stack corresponding to each corner near the common vertex of the first and second fields of each set. Other aspects include the first and second fields of each set being not vertical aligned. Further aspects include the corner near the common vertex of the first field and the corner near the common vertex of the second field of each set being uniformly distributed among the plural sets of four fields before forming the virtual stack. Additional aspects include decomposing the measured overlay values by: comparing the measured overlay values to modelled wafer data to determine the measured interfield and intrafield correctable errors; and subtracting the measured interfield and intrafield correctable errors from the measured overlay values to determine the measured interfield and intrafield non-correctable errors. Another aspect includes determining the measured interfield correctable and non-correctable errors for predicting the overlay values, respectively, by: averaging the measured interfield correctable errors for a corner near the common vertex of a third field and a corner near the common vertex of a fourth field of each set; and averaging the measured interfield non-correctable errors for the corner near the common vertex of the third field and the corner near the common vertex of the fourth field of each set. Other aspects include determining the average intrafield correctable and non-correctable errors for predicting the overlay values, respectively, by: copying the average intrafield correctable error for each corner of the virtual stack corresponding to each corner near the common vertex of the first and second fields of each set, respectively; and copying the average intrafield non-correctable error of each corner of the virtual stack corresponding to each corner near the common vertex of the first and second fields of each set, respectively.

Another aspect of the present disclosure is an apparatus including: a memory including computer program code for one or more programs, the memory and the computer program code configured to, with the processor, cause the apparatus to perform the following, provide a wafer having plural sets of four fields, each field having four corners and the four fields of each set sharing a common vertex; measure overlay values near each corner of each field of each set, except for a corner near the common vertex of a first field and a corner near the common vertex of a second field of each set; decompose the measured overlay values into measured interfield correctable and non-correctable errors and measured intrafield correctable and non-correctable errors; form a virtual stack of all fields of the wafer; determine an average intrafield correctable error and an average intrafield non-correctable error for each corner of the virtual stack based on the measured intrafield correctable and non-correctable errors, respectively; and predict the overlay values for the corners near the common vertex of the first and second fields of each set based on combinations of the measured interfield correctable and non-correctable errors, the average intrafield correctable errors, and the average non-correctable errors.

Aspects of the apparatus include the combinations for predicting the overlay values being respectively distinguished by the average intrafield correctable error and the average intrafield non-correctable error for each corner of the virtual stack corresponding to each corner near the common vertex of the first and second fields of each set. Other aspects include the first and second fields of each set being not vertical aligned. Further aspects include the corner near the common vertex of the first field and the corner near the common vertex of the second field of each set being uniformly distributed among the plural sets of four fields before forming the virtual stack. Additional aspects include the apparatus being further caused, with respect to decomposing the measured overlay values, to: compare the measured overlay values to modelled wafer data to determine the measured interfield and intrafield correctable errors; and subtract the measured interfield and intrafield correctable errors from the measured overlay values to determine the measured interfield and intrafield non-correctable errors. Another aspect includes the apparatus being further caused, with respect to determining the measured interfield correctable and non-correctable errors for predicting the overlay values, respectively, to: average the measured interfield correctable errors for a corner near the common vertex of a third field and a corner near the common vertex of a fourth field of each set; and average the measured interfield non-correctable errors for the corner near the common vertex of the third field and the corner near the common vertex of the fourth field of each set. Other aspects include the apparatus being further caused, with respect to determining the average intrafield correctable and non-correctable errors for predicting the overlay values, respectively, to: copy the average intrafield correctable error for each corner of the virtual stack corresponding to each corner near the common vertex of the first and second fields of each set; and copy the average intrafield non-correctable error of each corner of the virtual stack corresponding to each corner near the common vertex of the first and second fields of each set, respectively.

A further aspect of the present disclosure is a method including: providing a wafer having plural sets of four fields, each field having four corners and the four fields of each set sharing a common vertex; measuring overlay values near each corner of each field of each set, except for a corner near the common vertex of a first field and a corner near the common vertex of a second field of each set; distributing evenly among the plural sets of four fields the corner near the common vertex of the first field and the corner near the common vertex of the second field of each set that are not measured; decomposing the measured overlay values into measured interfield correctable and non-correctable errors and measured intrafield correctable and non-correctable errors; forming a virtual stack of all fields of the wafer; determining an average intrafield correctable error and an average intrafield non-correctable error for each corner of the virtual stack based on the measured intrafield correctable and non-correctable errors, respectively; and predicting the overlay values for the corners near the common vertex of the first and second fields of each set based on combinations of the measured interfield correctable and non-correctable errors, the average intrafield correctable errors, and the average non-correctable errors.

Aspects of the present disclosure include the combinations for predicting the overlay values being respectively distinguished by the average intrafield correctable error and the average intrafield non-correctable error for each corner of the virtual stack corresponding to each corner near the common vertex of the first and second fields of each set. Other aspects include the first and second fields of each set being not vertical aligned. Further aspects include decomposing the measured overlay values by: comparing the measured overlay values to modelled wafer data to determine the measured interfield and intrafield correctable errors; and subtracting the measured interfield and intrafield correctable errors from the measured overlay values to determine the measured interfield and intrafield non-correctable errors. Additional aspects include determining the measured interfield correctable and non-correctable errors for predicting the overlay values, respectively, by: averaging the measured interfield correctable errors for a corner near the common vertex of a third field and a corner near the common vertex of a fourth field of each set; and averaging the measured interfield non-correctable errors for the corner near the common vertex of the third field and the corner near the common vertex of the fourth field of each set. Another aspect includes determining the average intrafield correctable and non-correctable errors for predicting the overlay values, respectively, by: copying the average intrafield correctable error for each corner of the virtual stack corresponding to each corner near the common vertex of the first and second fields of each set; and copying the average intrafield non-correctable error of each corner of the virtual stack corresponding to each corner near the common vertex of the first and second fields of each set, respectively.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reduced throughout or diminished wafer production quality attendant upon overlay measurements of all corners of all fields or decreased measurement sampling, respectively, in semiconductor devices formed by lithography.

Methodology in accordance with embodiments of the present disclosure includes providing a wafer having plural sets of four fields, each field having four corners and the four fields of each set sharing a common vertex. Overlay values are measured near each corner of each field of each set, except for a corner near the common vertex of a first field and a corner near the common vertex of a second field of each set. The measured overlay values are decomposed into measured interfield correctable and non-correctable errors and measured intrafield correctable and non-correctable errors. A virtual stack of all fields of the wafer is then formed and an average intrafield correctable error and an average intrafield non-correctable error are determined for each corner of the virtual stack based on the measured intrafield correctable and non-correctable errors, respectively. The overlay values for the corners near the common vertex of the first and second fields of each set are then predicted based on combinations of the measured interfield correctable and non-correctable errors, the average intrafield correctable errors, and the average non-correctable errors.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
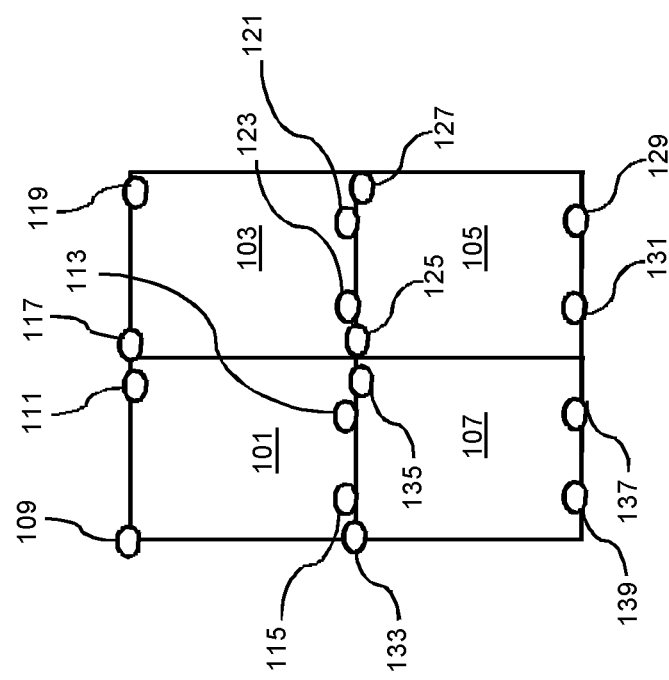
FIG. 1 schematically illustrates current standard overlay measurement sites on four sample fields of a wafer.

FIG. 1 schematically illustrates current standard overlay measurement sites on four sample fields of a wafer. Adverting to FIG. 1, fields 101, 103, 105, and 107, of a wafer (not shown for illustrative convenience) form one set of many four field sets of the wafer. As described above, a known approach to ensure the quality of the wafer production is to measure the overlay at each corner or standard overlay measurement site of each field of the wafer. For example, field 101 would be measured at the corners 109, 111, 113, and 115; field 103 would be measured at the corners 117, 119, 121, and 123; field 105 would be measured at the corners 125, 127, 129, and 131; and field 107 would be measured at the corners 133, 135, 137, and 139. Consequently, 16 overlay measurements would be made for the fields 101, 103, 105, and 107. This process would amount to 1200 to 1500 measurements across the entire wafer, which would equate to approximately 2500 measurements per lot of wafers and, therefore, have a large impact on the throughput of the foundry.

Figure 2:
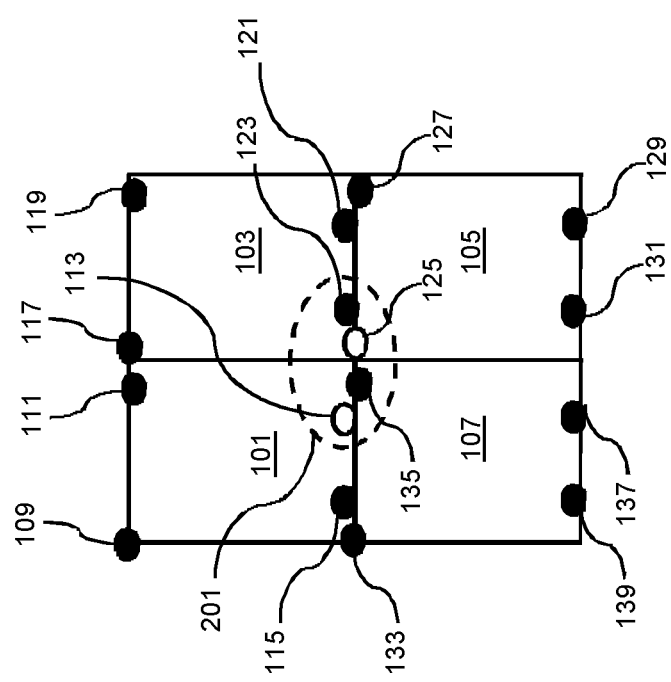
FIG. 2 schematically illustrates the four overlay measurement sites near a common vertex which are very close to each other and for which two overlay measurements may be skipped and overlay can be predicted, in accordance with an exemplary embodiment.

Adverting to FIG. 2, in accordance with an exemplary embodiment, rather than measure all 16 corners of the fields 101, 103, 105, and 107, two corners near the common vertex of the set of four fields are left unmeasured, highlighted by the dashed line 201. In this instance, the corner 113 of field 101 and the corner 125 of field 105 are left unmeasured. As a result of the closeness of the corners 113, 123, 125, and 135, the measurements of two corners may be skipped, and the overlay for those two corners can be predicted. The accuracy of the predicted overlay measurements may be ensured, for example, by making sure that the two of the four fields for which a corner of each field near the common vertex are skipped are not vertically aligned and, therefore, preventing two adjacent corners from being skipped.

Overlay values are composed of interfield correctable and non-correctable errors and intrafield correctable and non-correctable errors. Interfield errors are found across a wafer and are caused, for example, by the chuck of the machine, incoming process effects, non-optimal values given by APC, etc. An interfield error occurring at one particular point will reoccur at a point that is in close proximity. Therefore, an interfield error at one particular point can be predicted by averaging the vectors or values in its close proximity. In contrast, intrafield errors are found across a field and are caused, for example, by the lens, reticle, as well as non-optimal APC feedback, etc.

Once the overlay values of the 14 corners of each set, e.g., fields 101, 103, 105, and 107, are measured, the measured overlay values may be decomposed, for example, by comparing the measured overlay values to modelled wafer data, e.g., using wafer modeling software, to determine the measured interfield and intrafield correctable errors of the 14 corners of each set. The measured interfield and intrafield correctable errors are then subtracted from the measured overlay values to determine the measured interfield and intrafield non-correctable errors of the 14 corners of each set.

Figure 3:
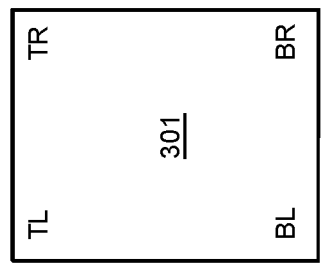
FIG. 3 schematically illustrates a labeling of overlay measurement sites for a stack of all of the fields of the wafer, in accordance with an exemplary embodiment.

Next, all of the fields of the wafer are virtually stacked, e.g., using modeling software, forming the virtual stacked field 301. The four corners or standard overlay measurement sites of the stacked field 301 may be labeled, for example, as top left (TL), top right (TR), bottom right (BR), and bottom left (BL), as depicted in FIG. 3. When stacking all of the fields of the wafer, the average values at the four corners will give the field signature. The field signature roughly repeats at every field. Using this fact, the intrafield correctable and non-correctable errors at a particular corner of the field may be determined. Specifically, an average intrafield correctable error and an average intrafield non-correctable error for each corner of the stacked field 301 are determined by averaging all of the measured intrafield correctable errors and by averaging all of the non-correctable errors, respectively. To ensure that there is sufficient data for the stacked field 301 and, therefore, the accuracy of an average intrafield correctable error and an average intrafield non-correctable error for each corner of the stacked field 301, the skipped corners near the common vertex, for example corners 113 and 125, need to be uniformly distributed among the plural sets of four fields before forming the stacked field 301.

Once the measured interfield correctable and non-correctable errors, the average intrafield correctable errors, and the average intrafield non-correctable errors are known, the overlay values for the skipped corners may be predicted based on combinations of these values. In this instance, the measured interfield correctable errors for predicting the overlay values for the corners 113 and 125 are first determined by averaging the measured interfield correctable errors for the corner 135 of field 107 and the corner 123 of field 103. The average of the measured interfield correctable errors, e.g., value A, is the same for both corners 113 and 125.

Next, the intrafield correctable errors for the corners 113 and 125 are determined by copying the average intrafield correctable error for each corner of the stacked field 301 corresponding to the particular corner. In this instance, the corner BR of the stacked field 301 corresponds to the corner 113 of field 101 and the corner TL of the stacked field 301 corresponds to the corner 125 of field 105. Therefore, the average intrafield correctable error for corner 113 is copied from the average intrafield correctable error determined for the corner BR of the stacked field 301, e.g., value B, and the average intrafield correctable error for the corner 125 is copied from the average intrafield correctable error determined for the corner TL of the stacked field 301, e.g., value C.

The measured interfield non-correctable errors for predicting the overlay values for the corners 113 and 125 are then determined the same way that the measured interfield correctable errors for the corners 113 and 125 are determined. For instance, an average of the measured interfield non-correctable errors for the corner 135 of field 107 and the corner 123 of field 103 is determined, e.g., value D. Again, the average of the measured interfield non-correctable errors is the same for both corners 113 and 125.

Thereafter, the intrafield non-correctable errors for the corners 113 and 125 are determined the same way as the intrafield correctable for the corners 113 and 125 are determined, i.e., copied from the average intrafield non-correctable error for each corner of the stacked field 301 corresponding to the particular corner. Specifically, the average intrafield non-correctable error for corner 113 is copied from the average intrafield non-correctable error determined for the corner BR of the stacked field 301, e.g., value E, and the average intrafield non-correctable error for the corner 125 is copied from the average intrafield non-correctable error determined for the corner TL of the stacked 301, e.g., value F.

Consequently, the combinations of values for predicting the overlay values are respectively distinguished by the average intrafield correctable error and the average intrafield non-correctable error for the corners BR and TL of the stacked field 301 corresponding to the corners 113 and 125, respectively. For example, the predicted overlay value of the corner 113 is determined from the addition of values A, B, D, and E and the predicted overlay value of the corner 125 is determined from the addition of values A, C, D, and F.

The embodiments of the present disclosure can achieve several technical effects including improving foundry throughput by measuring fewer data points while still maintaining high wafer production quality. The quality of wafer production can be further improved through the embodiments of the present disclosure by increasing the lot/wafer sampling (e.g., only skipping one corner near the common vertex of the set of four fields for measurement) or by measuring in regions prone to having marginality issues. Embodiments of the present disclosure enjoy utility in various industrial applications as, for example, microprocessors, smart phones, mobile phones, cellular handsets, set-top boxes, DVD recorders and players, gaming systems, and digital cameras. The present disclosure therefore enjoys industrial applicability in semiconductor devices formed by lithography.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a wafer having plural sets of four fields, each field having four corners and the four fields of each set sharing a common vertex;
measuring overlay values near each corner of each field of each set, except for a corner near the common vertex of a first field and a corner near the common vertex of a second field of each set;
decomposing the measured overlay values into measured interfield correctable and non-correctable errors and measured intrafield correctable and non-correctable errors;
forming a virtual stack of all fields of the wafer by way of wafer modeling software;
determining an average intrafield correctable error and an average intrafield non-correctable error for each corner of the virtual stack based on the measured intrafield correctable and non-correctable errors, respectively;
predicting the overlay values for the corners near the common vertex of the first and second fields of each set based on combinations of the measured interfield correctable and non-correctable errors, the average intrafield correctable errors, and the average non-correctable errors; and
performing lithography on the wafer.

2. The method according to claim 1, wherein the combinations for predicting the overlay values are respectively distinguished by the average intrafield correctable error and the average intrafield non-correctable error for each corner of the virtual stack corresponding to each corner near the common vertex of the first and second fields of each set.

3. The method according to claim 1, wherein the first and second fields of each set are not vertical aligned.

4. The method according to claim 1, wherein the corner near the common vertex of the first field and the corner near the common vertex of the second field of each set are uniformly distributed among the plural sets of four fields before forming the virtual stack.

5. The method according to claim 1, comprising decomposing the measured overlay values by:
comparing the measured overlay values to modelled wafer data to determine the measured interfield and intrafield correctable errors; and
subtracting the measured interfield and intrafield correctable errors from the measured overlay values to determine the measured interfield and intrafield non-correctable errors.

6. The method according to claim 1, comprising determining the measured interfield correctable and non-correctable errors for predicting the overlay values, respectively, by:
averaging the measured interfield correctable errors for a corner near the common vertex of a third field and a corner near the common vertex of a fourth field of each set; and
averaging the measured interfield non-correctable errors for the corner near the common vertex of the third field and the corner near the common vertex of the fourth field of each set.

7. The method according to claim 1, comprising determining the average intrafield correctable and non-correctable errors for predicting the overlay values, respectively, by:
copying the average intrafield correctable error for each corner of the virtual stack corresponding to each corner near the common vertex of the first and second fields of each set, respectively; and
copying the average intrafield non-correctable error of each corner of the virtual stack corresponding to each corner near the common vertex of the first and second fields of each set, respectively.

8. An apparatus comprising:
a processor; and
a memory including computer program code for one or more programs, the memory and the computer program code configured to, with the processor, cause the apparatus to perform the following,
provide a wafer having plural sets of four fields, each field having four corners and the four fields of each set sharing a common vertex;
measure overlay values near each corner of each field of each set, except for a corner near the common vertex of a first field and a corner near the common vertex of a second field of each set;
decompose the measured overlay values into measured interfield correctable and non-correctable errors and measured intrafield correctable and non-correctable errors;
form a virtual stack of all fields of the wafer by way of wafer modeling software;
determine an average intrafield correctable error and an average intrafield non-correctable error for each corner of the virtual stack based on the measured intrafield correctable and non-correctable errors, respectively;
predict the overlay values for the corners near the common vertex of the first and second fields of each set based on combinations of the measured interfield correctable and non-correctable errors, the average intrafield correctable errors, and the average non-correctable errors; and
perform lithography on the wafer.

9. The apparatus according to claim 8, wherein the combinations for predicting the overlay values are respectively distinguished by the average intrafield correctable error and the average intrafield non-correctable error for each corner of the virtual stack corresponding to each corner near the common vertex of the first and second fields of each set.

10. The apparatus according to claim 8, wherein the first and second fields of each set are not vertical aligned.

11. The apparatus according to claim 8, wherein the corner near the common vertex of the first field and the corner near the common vertex of the second field of each set are uniformly distributed among the plural sets of four fields before forming the virtual stack.

12. The apparatus according to claim 8, wherein the apparatus is further caused, with respect to decomposing the measured overlay values, to:
compare the measured overlay values to modelled wafer data to determine the measured interfield and intrafield correctable errors; and
subtract the measured interfield and intrafield correctable errors from the measured overlay values to determine the measured interfield and intrafield non-correctable errors.

13. The apparatus according to claim 8, wherein the apparatus is further caused, with respect to determining the measured interfield correctable and non-correctable errors for predicting the overlay values, respectively, to:
average the measured interfield correctable errors for a corner near the common vertex of a third field and a corner near the common vertex of a fourth field of each set; and
average the measured interfield non-correctable errors for the corner near the common vertex of the third field and the corner near the common vertex of the fourth field of each set.

14. The apparatus according to claim 8, wherein the apparatus is further caused, with respect to determining the average intrafield correctable and non-correctable errors for predicting the overlay values, respectively, to:
copy the average intrafield correctable error for each corner of the virtual stack corresponding to each corner near the common vertex of the first and second fields of each set; and
copy the average intrafield non-correctable error of each corner of the virtual stack corresponding to each corner near the common vertex of the first and second fields of each set, respectively.

15. A method comprising:
providing a wafer having plural sets of four fields, each field having four corners and the four fields of each set sharing a common vertex;
measuring overlay values near each corner of each field of each set, except for a corner near the common vertex of a first field and a corner near the common vertex of a second field of each set;
distributing evenly among the plural sets of four fields the corner near the common vertex of the first field and the corner near the common vertex of the second field of each set that are not measured;
decomposing the measured overlay values into measured interfield correctable and non-correctable errors and measured intrafield correctable and non-correctable errors;
forming a virtual stack of all fields of the wafer by way of wafer modeling software;
determining an average intrafield correctable error and an average intrafield non-correctable error for each corner of the virtual stack based on the measured intrafield correctable and non-correctable errors, respectively;
predicting the overlay values for the corners near the common vertex of the first and second fields of each set based on combinations of the measured interfield correctable and non-correctable errors, the average intrafield correctable errors, and the average non-correctable errors; and
performing lithography on the wafer.

16. The method according to claim 15, wherein the combinations for predicting the overlay values are respectively distinguished by the average intrafield correctable error and the average intrafield non-correctable error for each corner of the virtual stack corresponding to each corner near the common vertex of the first and second fields of each set.

17. The method according to claim 15, wherein the first and second fields of each set are not vertical aligned.

18. The method according to claim 15, comprising decomposing the measured overlay values by:
comparing the measured overlay values to modelled wafer data to determine the measured interfield and intrafield correctable errors; and
subtracting the measured interfield and intrafield correctable errors from the measured overlay values to determine the measured interfield and intrafield non-correctable errors.

19. The method according to claim 15, comprising determining the measured interfield correctable and non-correctable errors for predicting the overlay values, respectively, by:
averaging the measured interfield correctable errors for a corner near the common vertex of a third field and a corner near the common vertex of a fourth field of each set; and
averaging the measured interfield non-correctable errors for the corner near the common vertex of the third field and the corner near the common vertex of the fourth field of each set.

20. The method according to claim 15, comprising determining the average intrafield correctable and non-correctable errors for predicting the overlay values, respectively, by:
   copying the average intrafield correctable error for each corner of the virtual stack corresponding to each corner near the common vertex of the first and second fields of each set; and
   copying the average intrafield non-correctable error of each corner of the virtual stack corresponding to each corner near the common vertex of the first and second fields of each set, respectively.

\* \* \* \* \*